United States Patent
Huang

(10) Patent No.: US 9,520,470 B1
(45) Date of Patent: Dec. 13, 2016

(54) LATERAL DOUBLE DIFFUSED METAL OXIDE SEMICONDUCTOR DEVICE AND MANUFACTURING METHOD THEREOF

(71) Applicant: RICHTEK TECHNOLOGY CORPORATION, Zubei, Hsinchu (TW)

(72) Inventor: Tsung-Yi Huang, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 14/939,913

(22) Filed: Nov. 12, 2015

(30) Foreign Application Priority Data

Aug. 18, 2015 (TW) .............................. 104126785 A

(51) Int. Cl.
| | |
|---|---|
| *H01L 29/78* | (2006.01) |
| *H01L 29/10* | (2006.01) |
| *H01L 29/66* | (2006.01) |
| *H01L 29/06* | (2006.01) |
| *H01L 29/08* | (2006.01) |

(52) U.S. Cl.
CPC ....... *H01L 29/1095* (2013.01); *H01L 29/0653* (2013.01); *H01L 29/0865* (2013.01); *H01L 29/1083* (2013.01); *H01L 29/66681* (2013.01); *H01L 29/7816* (2013.01)

(58) Field of Classification Search
CPC .............................. H01L 29/7816; H01L 21/04
USPC ......................................................... 257/343
See application file for complete search history.

(56) References Cited

U.S. PATENT DOCUMENTS 9,343,453 B2 * 5/2016 Kanda .................. H01L 29/402

* cited by examiner

*Primary Examiner* — Mark Prenty
(74) *Attorney, Agent, or Firm* — Tung & Associates

(57) ABSTRACT

A lateral double diffused metal oxide semiconductor device, includes: a P-type substrate, an epitaxial layer, a P-type high voltage well, a P-type body region, an N-type well, an isolation oxide region, a drift oxide region, a gate, an N-type contact region, a P-type contact region, a top source, a bottom source, and an N-type drain. The P-type body region is between and connects the P-type high voltage well and the surface of the epitaxial layer. The P-type body region includes a peak concentration region, which is beneath and indirect contact the surface of the epitaxial layer, wherein the peak concentration region has a highest P-type impurity concentration in the P-type body region. The P-type impurity concentration of the P-type body region is higher than a predetermined threshold to suppress a parasitic bipolar transistor such that it does not turn ON.

5 Claims, 5 Drawing Sheets

LATERAL DOUBLE DIFFUSED METAL OXIDE SEMICONDUCTOR DEVICE AND MANUFACTURING METHOD THEREOF

CROSS REFERENCE

The present invention claims priority to TW 104126785, filed on Aug. 18, 2015.

BACKGROUND OF THE INVENTION

Field of Invention

The present invention relates to a lateral double diffused metal oxide semiconductor (LDMOS) device and a manufacturing method thereof; particularly, it relates to such an LDMOS device having a reduced conduction resistance and a manufacturing method thereof.

Description of Related Art

FIG. 1 is a schematic diagram showing a cross-section view of a prior art lateral double diffused metal oxide semiconductor (LDMOS) device 100. As shown in FIG. 1, the LDMOS device 100 includes: a P-type substrate 101, a drift region 102, an isolation oxide region 103, a drift oxide region 104, a body region 106, a drain 110, a source 108, and a gate 111. The drift region 102 is formed on the P-type substrate 101, and has a conductive type of N-type. The isolation oxide region 103, which is shown to be a local oxidation of silicon (LOCOS) structure, defines an operation region 103a which is a major active region for the operation of the LDMOS device. The gate 111 overlays part of the drift oxide region 104. In order to increase a withstand voltage of the LDMOS device 100 as a power device, the drift oxide region 104 has a considerable thickness. However, this increases the conduction resistance of the LDMOS device 100, so the operation speed and hence the performance of the LDMOS device 100 are decreased. Besides, a parasitic NPN transistor formed by the N-type source 108, the P-type body region 106, and the N-type drift region 102 also limits the operation speed and the performance of the LDMOS device 100.

In view of above, to overcome the drawbacks in the prior art, the present invention proposes an LDMOS device and a manufacturing method thereof, wherein the conduction resistance is reduced, and the parasitic NPN transistor is suppressed.

SUMMARY OF THE INVENTION

The present invention provides a lateral double diffused metal oxide semiconductor (LDMOS) device, including: a P-type substrate, which has an upper surface and a lower surface opposite to each other in a vertical direction; an epitaxial layer, which is formed on the P-type substrate and in direct contact with the upper surface, and has an epitaxial layer surface opposite to the upper surface in the vertical direction; a P-type high voltage well, which is formed in the epitaxial layer, and is in direct contact with the upper surface of the P-type substrate; a P-type body region, which is formed in the epitaxial layer and on the P-type high voltage well, the P-type body region being located between and connecting the P-type high voltage well and the epitaxial layer surface, wherein the P-type body region includes a peak concentration region which has a highest P-type impurity concentration in the P-type body region, the peak concentration region being in direct contact with and beneath the epitaxial layer surface; an N-type well, which is formed in the epitaxial layer, the N-type well being in direct contact with and beneath the epitaxial layer surface in the vertical direction, and being adjacent to the P-type body region in a lateral direction; an isolation oxide region, which is formed on the epitaxial layer to define an operation region; a drift oxide region, which is formed in the operation region and on the epitaxial layer, the drift oxide region being in direct contact with the N-type well in the vertical direction; a gate, which is formed in the operation region and on or above the epitaxial layer, the gate overlaying at least part of the drift oxide region, part of the N-type well and part of the P-type body region, part of the gate being in direct contact with the epitaxial layer; an N-type contact region, which is formed in the P-type body region, and is in direct contact with and beneath the epitaxial layer surface in the vertical direction; a P-type contact region, which is formed in the P-type body region, the P-type contact region being in direct contact with and beneath the epitaxial layer surface in the vertical direction, and being adjacent to the N-type contact region in the lateral direction; an top source, which is formed on the epitaxial layer, and is in direct contact with the N-type contact region and the P-type contact region in the vertical direction; a bottom source, which is formed beneath the lower surface of the P-type substrate in the vertical direction, and is in direct contact with the lower surface; and an N-type drain, which is formed in the N-type well, and is in direct contact with and beneath the epitaxial layer surface, wherein the N-type drain is located between the drift oxide region and the isolation oxide region; wherein the P-type impurity concentration in the P-type body region is higher than a predetermined threshold to suppress a conduction of a lateral parasitic transistor formed by the N-type contact region, the P-type body region, and the N-type well; wherein part of the P-type body region is located beneath the N-type contact region and the P-type contact region in the vertical direction, wherein the peak concentration region is not located below the N-type contact region and the P-type contact region in the vertical direction, and the peak concentration region is adjacent to the N-type contact region in the lateral direction; wherein a conductive current flows from the N-type drain to the bottom source in a normal operation when the LDMOS device is turned ON.

The present invention also provides a manufacturing method of a lateral double diffused metal oxide semiconductor (LDMOS) device, including: providing a P-type substrate, which has an upper surface and a lower surface opposite to each other in a vertical direction; forming an epitaxial layer on the P-type substrate, wherein the epitaxial layer is in direct contact with the upper surface and has an epitaxial layer surface opposite to the upper surface in the vertical direction; forming a P-type high voltage well in the epitaxial layer, wherein the P-type high voltage well is in direct contact with the upper surface of the P-type substrate; forming a P-type body region in the epitaxial layer and on the P-type high voltage well, the P-type body region being formed between and connecting the P-type well and the epitaxial layer surface, wherein the P-type body region includes a peak concentration region which has a highest P-type impurity concentration in the P-type body region, and the peak concentration region being in direct contact with and beneath the epitaxial layer surface; forming an N-type well in the epitaxial layer, wherein the N-type well is in direct contact with and beneath the epitaxial layer surface in the vertical direction, and is adjacent to the P-type body region in a lateral direction; forming an isolation oxide region on the epitaxial layer to define an operation region; forming a drift oxide region in the operation region and on the epitaxial layer, wherein the drift oxide region is in direct contact with the N-type well in the vertical direction; forming a gate on the epitaxial layer in the operation region and on or above the epitaxial layer, wherein the gate overlays at least part of the drift oxide region, part of the N-type well and part of the P-type body region, and part of the gate is in direct contact with the epitaxial layer; forming an N-type contact region in the P-type body region, wherein the N-type contact region is in direct contact with and beneath the epitaxial layer surface in the vertical direction; forming a P-type contact region in the P-type body region, wherein the P-type contact region is in direct contact with and beneath the epitaxial layer surface in the vertical direction, and is adjacent to the N-type contact region in the lateral direction; forming an top source on the epitaxial layer, wherein the top source is in direct contact with the N-type contact region and the P-type contact region in the vertical direction; forming a bottom source beneath the lower surface of the P-type substrate, wherein the bottom source is in direct contact with and beneath the lower surface in the vertical direction; and forming an N-type drain in the N-type well, wherein the N-type drain is in direct contact with and beneath the epitaxial layer surface, and the N-type drain is located between the drift oxide region and the isolation oxide region; wherein the P-type impurity concentration in the P-type body region is higher than a predetermined threshold to suppress a conduction of a lateral parasitic transistor conduction formed by the N-type contact region, the P-type body region, and the N-type well; wherein part of the P-type body region is located beneath the N-type contact region and the P-type contact region in the vertical direction, wherein the peak concentration region is not located below the N-type contact region and the P-type contact region in the vertical direction, and the peak concentration region is adjacent to the N-type contact region in the lateral direction; wherein a conductive current flows from the N-type drain to the bottom source in a normal operation when the LDMOS device is turned ON.

In one preferable embodiment, the isolation oxide region is a local oxidation of silicon (LOCOS) structure or a shallow trench isolation (STI) structure, and the drift oxide region is a local oxidation of silicon (LOCOS) structure or a shallow trench isolation (STI) structure.

In one preferable embodiment, the conductive current flows from the N-type drain, through the N-type well, the P-type body region, the N-type contact region, the top source, the P-type contact region, the P-type body region, the P-type high voltage well, and the P-type substrate, to the bottom source.

In one preferable embodiment, the top source includes a metal layer or a metal silicide layer.

In one preferable embodiment, the bottom source includes a metal layer or a metal silicide layer.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
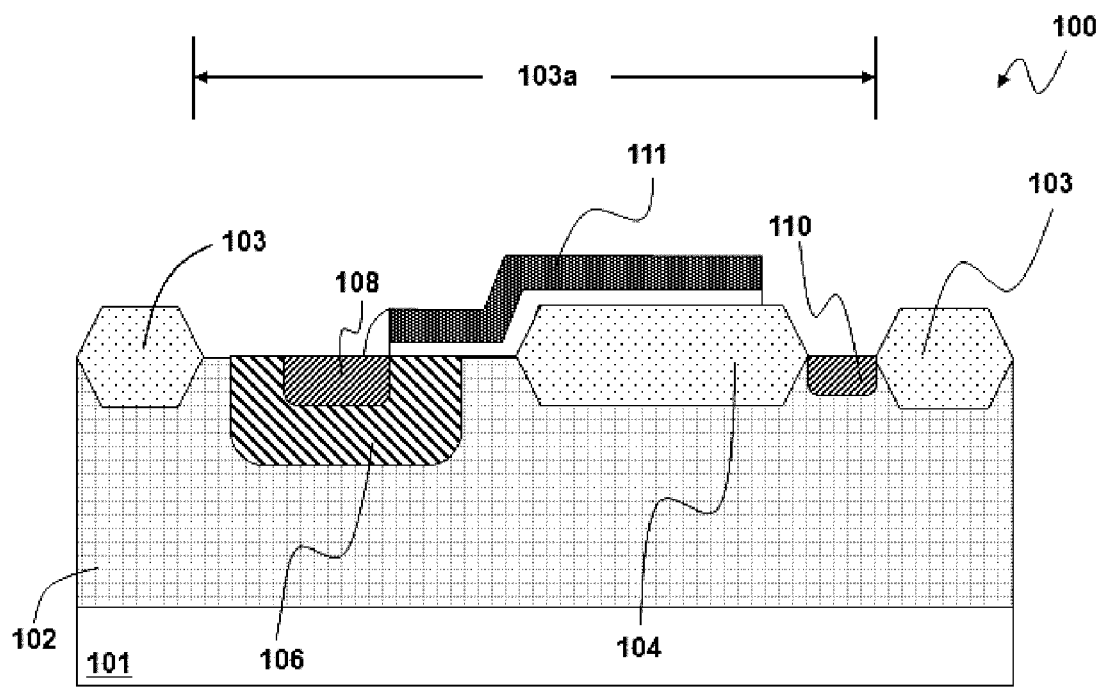
FIG. 1 shows a prior art lateral double diffused metal oxide semiconductor (LDMOS) device 100.
Figure 2:
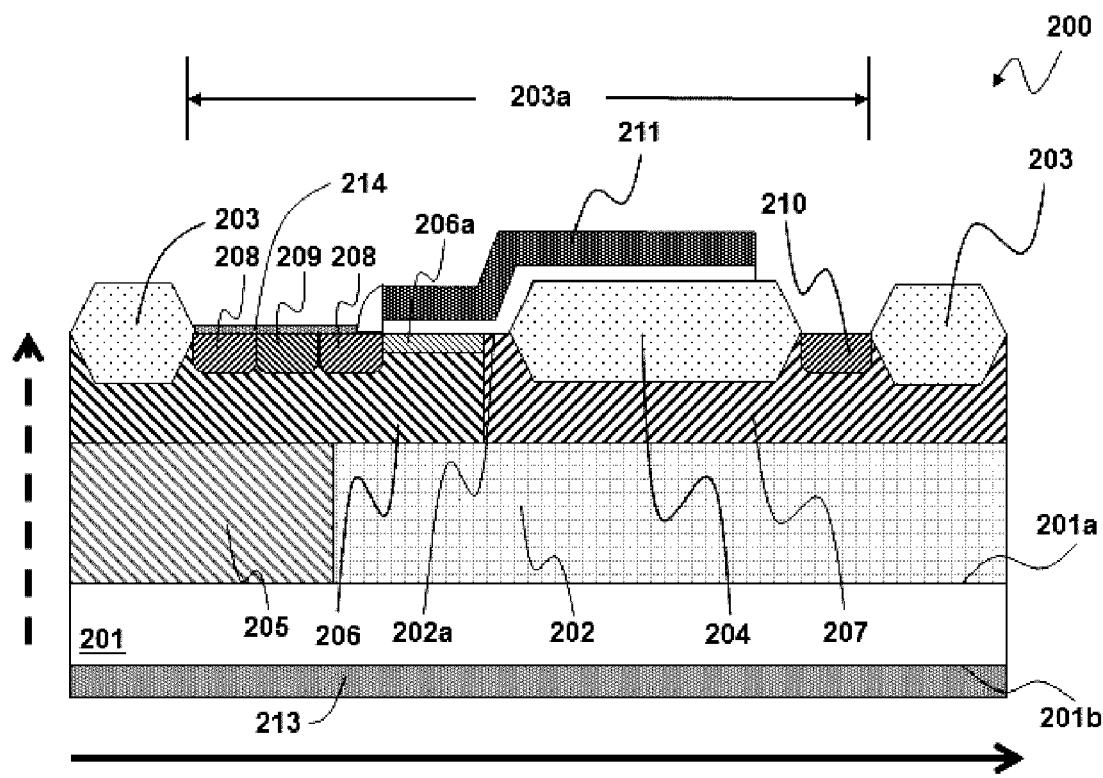
FIG. 2 shows a first embodiment of the present invention.

Please refer to FIG. 2 for a first embodiment according to the present invention, wherein FIG. 2 is a schematic diagram showing an LDMOS device 200 from a cross-section view. As shown in FIG. 2, the LDMOS device 200 includes: a P-type substrate 201, an epitaxial layer 202, an isolation oxide region 203, a drift oxide region 204, a P-type high voltage well 205, a P-type body region 206, an N-type well 207, an N-type contact region 208, a P-type contact region 209, an N-type drain 210, agate 211 (including gate electrode layer and gate dielectric layer), a bottom source 213, and a top source 214.

The P-type substrate 201 has an upper surface 201a and a lower surface 201b opposite to each other in a vertical direction (as indicated by a dashed bold arrow shown in the figure). The epitaxial layer 202 is formed on the P-type substrate 201; the epitaxial layer 202 is in direct contact with the upper surface 201a of the P-type substrate 201, and the epitaxial layer 202 has an epitaxial layer surface 202a opposite to the upper surface 201a in the vertical direction.

The P-type body region 206 is formed in the epitaxial layer 202 and on the P-type high voltage well 205; the P-type body region 206 is located between and connects the P-type high voltage well 205 and the epitaxial layer surface 202a, wherein the P-type body region 206 includes a peak concentration region 206a, which has a highest P-type impurity concentration in the P-type body region 206, in direct contact with and beneath the epitaxial layer surface 202a. The N-type well 207 is formed in the epitaxial layer 202, in direct contact with and beneath the epitaxial layer surface 202a in the vertical direction, and the N-type well 207 is adjacent to the P-type body region 206 in a lateral direction (as indicated by a solid bold arrow shown in the figure). The isolation oxide region 203 is formed on the epitaxial layer 202 to define an operation region 203a, wherein the operation region 203a is a region where, when the LDMOS device 200 is in normal operation (i.e., in ON and OFF states), charged particles are formed and move to produce an electric current, as well known by those skilled in the art. The drift oxide region 204 is formed in the operation region 203a and on the epitaxial layer 202, and the drift oxide region 204 is in direct contact with the N-type well 207 in the vertical direction. The gate 211 is formed on or above the epitaxial layer 202 within the operation region 203a, and overlays at least part of the drift oxide region 204; the gate 211 is in direct contact with the epitaxial layer 202, and the gate 211 overlays part of the N-type well 207 and part of the P-type body region 206.

The N-type contact region 208 is formed in the P-type body region 206, and is in direct contact with and beneath the epitaxial layer surface 206a in the vertical direction. The P-type contact region 209 is formed in the P-type body region 206, in direct contact with and beneath the epitaxial layer surface 206a in the vertical direction; the P-type contact region 209 is adjacent to the N-type contact region 208 in the lateral direction. The top source 214 is formed on the epitaxial layer 202, and is in direct contact with the N-type contact region 208 and the P-type contact region 209 in the vertical direction. The bottom source 213 is in direct contact with and beneath the lower surface 201b of the P-type substrate 201 in the vertical direction. The N-type drain 210 is formed in the N-type well 207, in direct contact with and beneath the epitaxial layer surface 206a in the vertical direction, and the N-type drain 210 is located between the drift oxide region 204 and the isolation oxide region 203. The P-type impurity concentration in the P-type body region 206 is sufficiently high (i.e., higher than a predetermined threshold) such that a lateral parasitic transistor formed by the N-type contact region 208, the P-type body region 206, and the N-type well 207, is not easily turned ON (i.e., to suppress the conduction of the above-mentioned lateral parasitic transistor). Particularly, the peak concentration region 206a which is adjacent to the N-type contact region 208 in the lateral direction, with the highest P-type impurity concentration in the P-type body region 206, further assists in suppressing the conduction of the lateral parasitic transistor. In normal operation when the LDMOS device 200 is turned ON, a conductive current flows from the N-type drain 210 to the bottom source 213 through a path as indicated by the solid bold arrow shown in FIG. 3I.

Figure 3A:
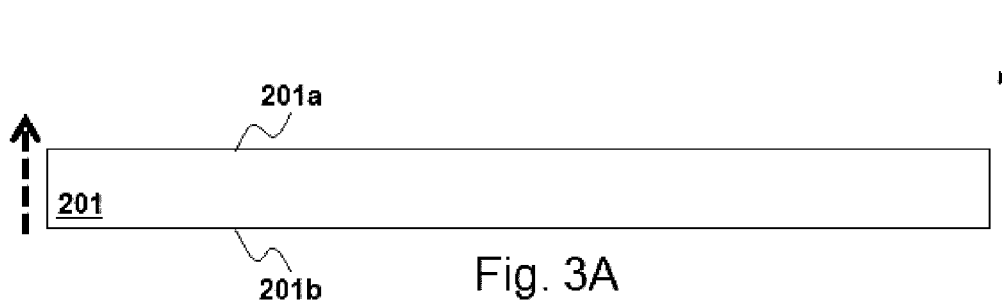
FIGS. 3A-3I show a second embodiment of the present invention.
Figure 3B:
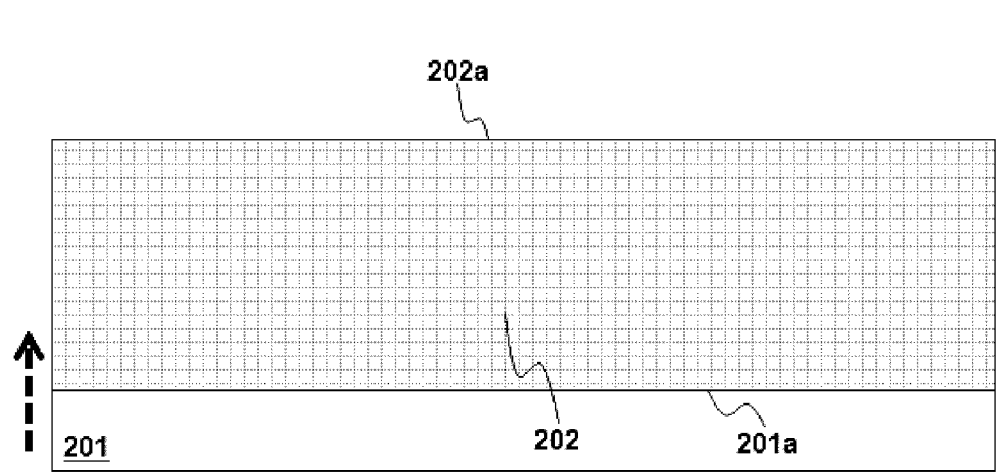

FIGS. 3A-3I show a second embodiment of the present invention. FIGS. 3A-3I are schematic diagrams showing a manufacturing method of the LDMOS device 200 from a cross-section view. First, as shown in FIG. 3A, a P-type substrate 201 is provided, which has an upper surface 201a and a lower surface 201b opposite to each other in a vertical direction (as indicated by a dashed bold arrow shown in the figure), wherein the P-type substrate 201 is for example but not limited to a P-type silicon substrate; in another embodiment, the substrate can be a P-type semiconductor substrate other than a silicon substrate. Next, as shown in FIG. 3B, an epitaxial layer 202 is formed on the P-type substrate 201 and in direct contact with the upper surface 201a, wherein the epitaxial layer 202 has an epitaxial layer surface 202a opposite to the upper surface 201a in the vertical direction. The epitaxial layer 202 is for example but not limited to a P-type epitaxial layer.

Figure 3C:
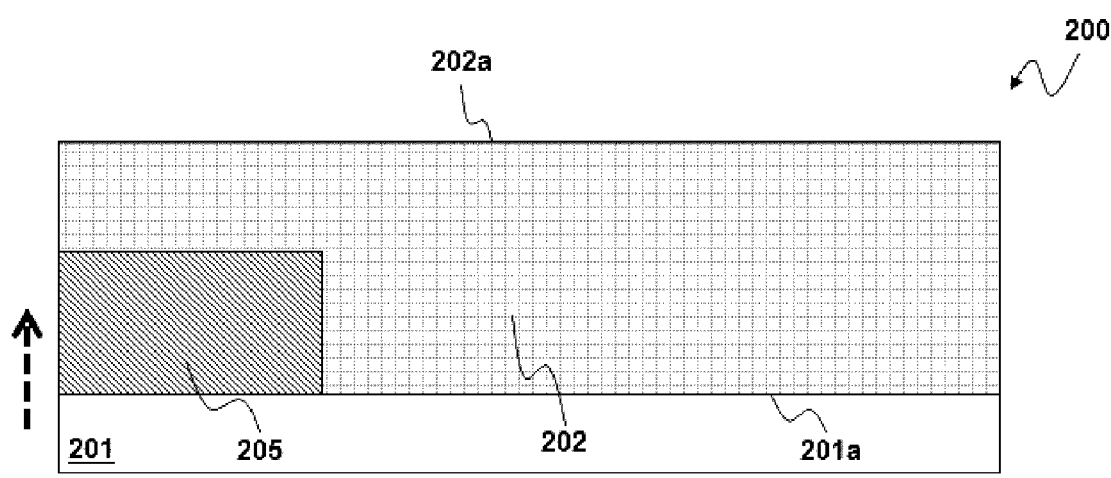
Figure 3D:
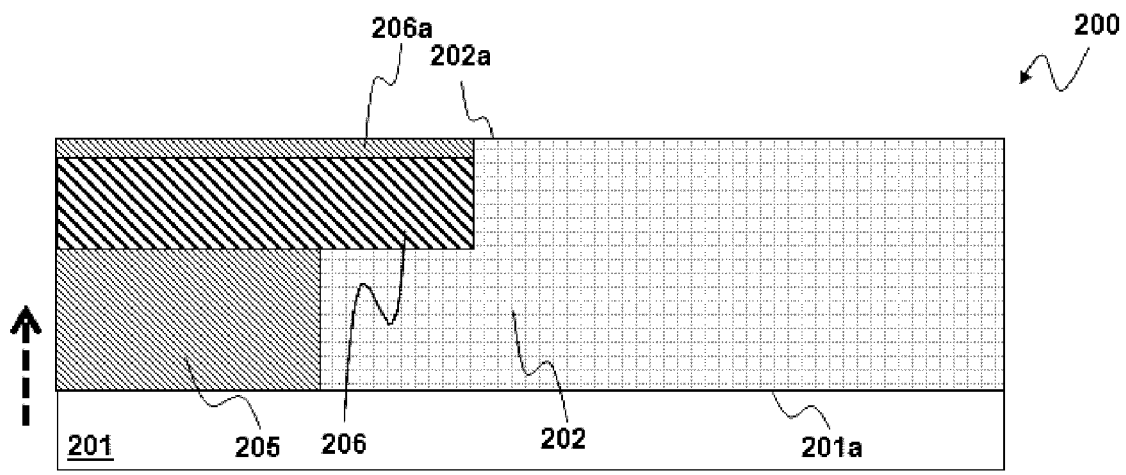

Next, as shown in FIG. 3C, a P-type high voltage well 205 is formed in the epitaxial layer 202, and the P-type high voltage well 205 is in direct contact with the upper surface 201a of the P-type substrate 201. The P-type high voltage well 205 can be formed by, for example but not limited to, a process including steps of lithography, ion implantation, and thermal diffusion (not shown). These steps are well known by those skilled in the art, so details thereof are omitted here. Next, as shown in FIG. 3D, the P-type body region 206 is formed in the epitaxial layer 202 and on the P-type high voltage well 205, and the P-type body region 206 is in direct contact with the P-type well 205 and the epitaxial layer surface 202a. The P-type body region 206 has a peak concentration region 206a, which is in direct contact with and beneath the epitaxial layer surface 202a; the peak concentration region 206a has a highest P-type impurity concentration in the P-type body region 206. The peak concentration region 206a can be formed by, for example but not limited to, a process including steps of lithography, ion implantation, and thermal diffusion (not shown), and by controlling parameters of the process, such as by adjusting an acceleration voltage of the ion implantation step to control the concentration distribution of the implanted impurities, the peak concentration region 206a can be formed beneath the epitaxial layer surface 202a in the epitaxial layer 202.

Figure 3E:
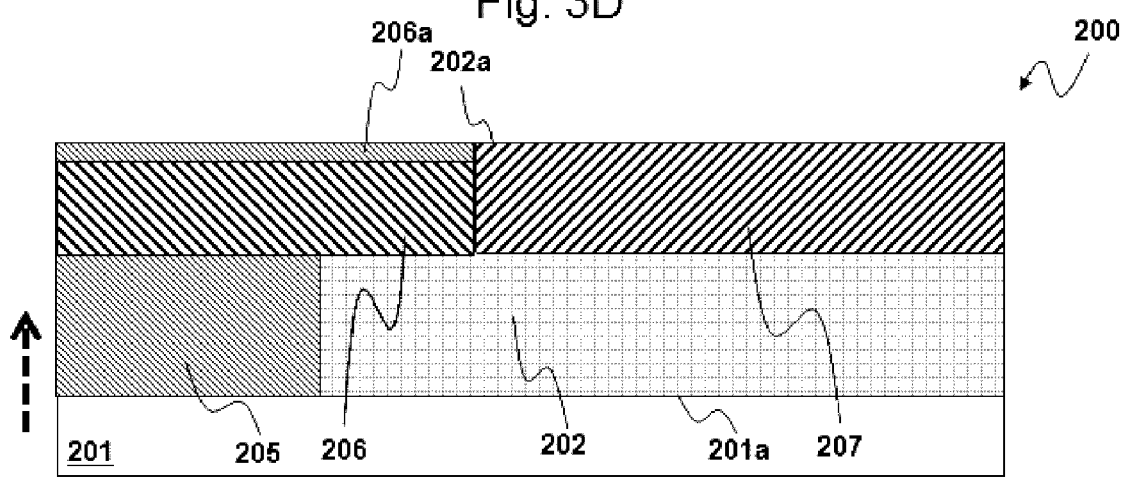
Figure 3F:
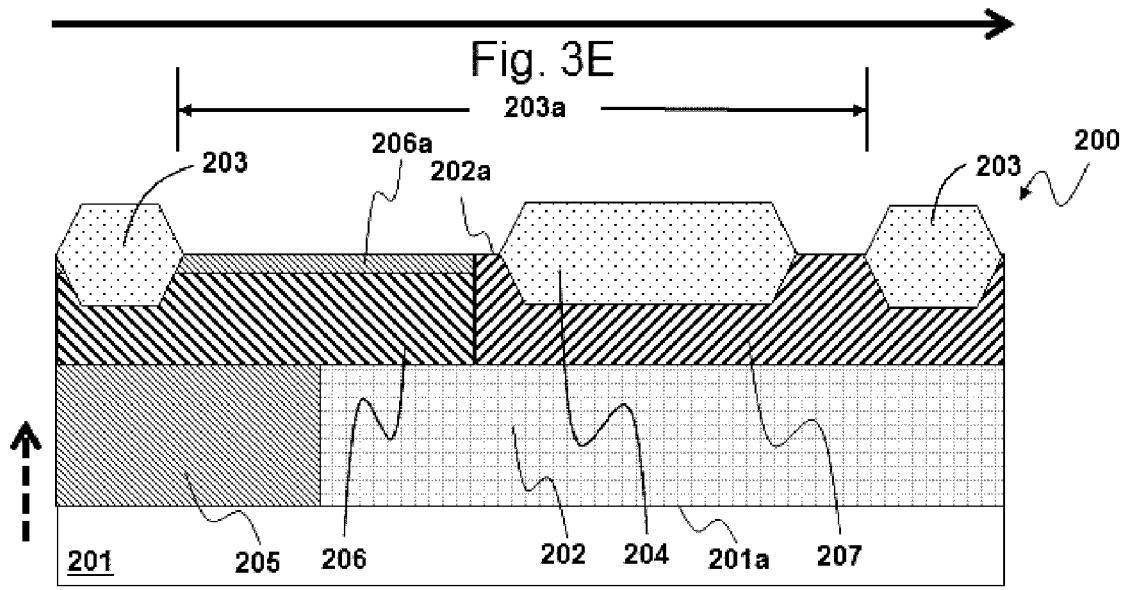

Next, as shown in FIG. 3E, the N-type well 207 is formed in the epitaxial layer 202, in direct contact with and beneath the epitaxial layer surface 202a in the vertical direction, and the N-type well 207 is adjacent to the P-type body region 206 in a lateral direction (as indicated by a solid bold arrow shown in the figure). Next, as shown in FIG. 3F, the isolation oxide region 203 is formed on the epitaxial layer 202 to define the operation region 203a. Meanwhile or in a next step, the drift oxide region 204 is formed in the operation region 203a on the epitaxial layer 202, and the drift oxide region 204 is in direct contact with the N-type well 207 in the vertical direction. The isolation oxide region 203 and the drift oxide region 204 for example can respectively be a local oxidation of silicon (LOCOS) structure or a shallow trench isolation (STI) structure.

Figure 3G:
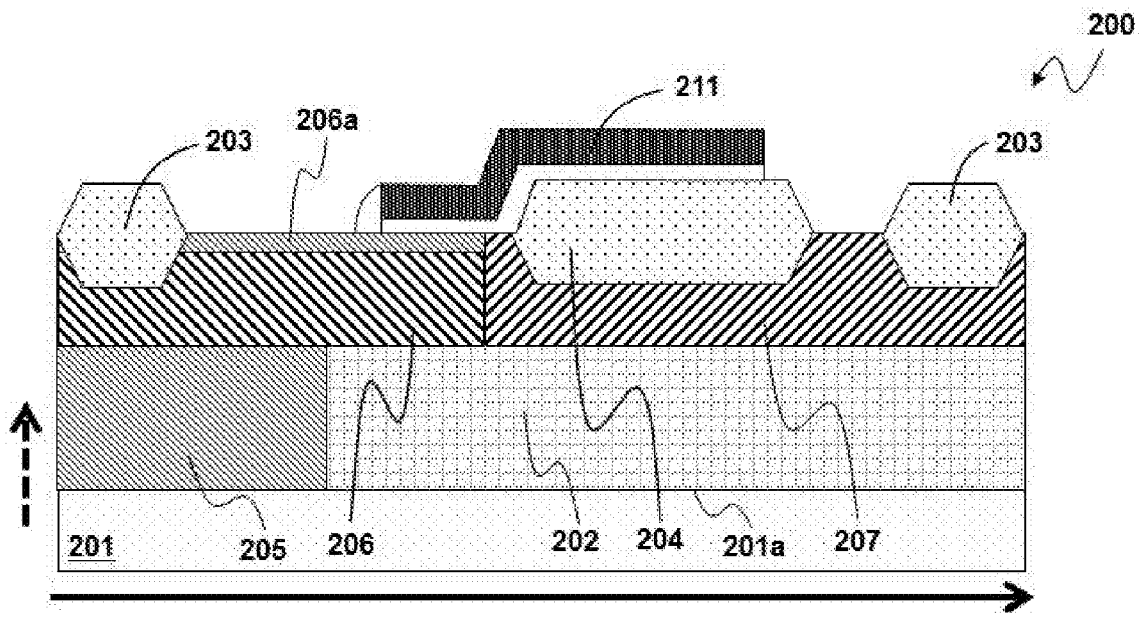
Figure 3H:
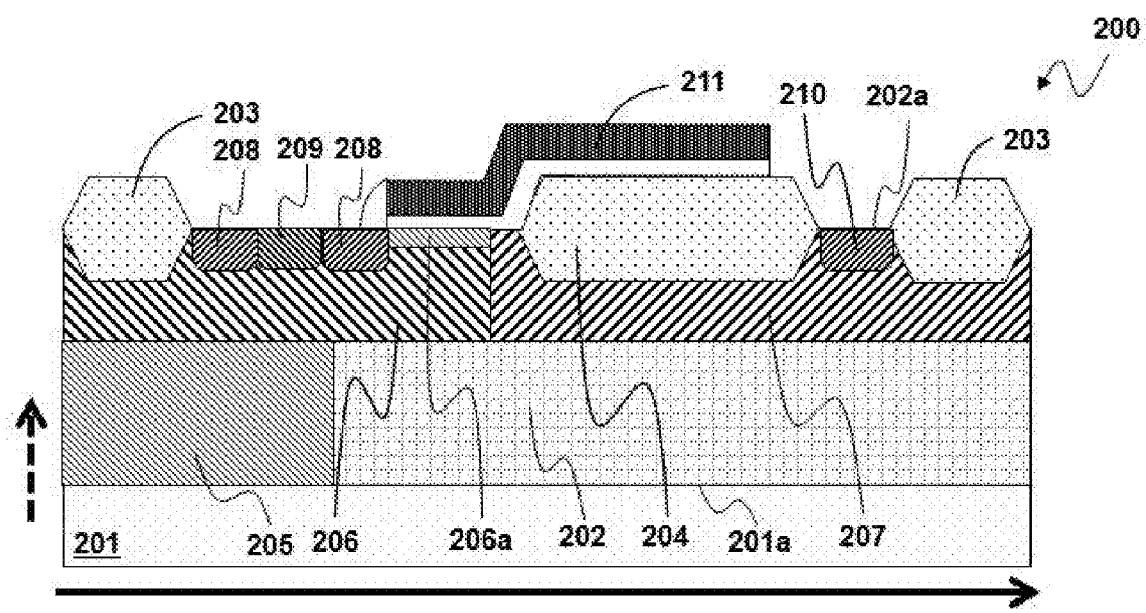

Next, as shown in FIG. 3G, the gate 211 is formed on the epitaxial layer 202 within the operation region 203a, and overlays at least part of the drift oxide region 204. The gate 211 is in direct contact with the epitaxial layer 202, and the gate 211 overlays part of the N-type well 207 and part of the P-type body region 206. Next, as shown in FIG. 3H, the N-type contact region 208 is formed in the P-type body region 206, in direct contact with and beneath the epitaxial layer surface 202a in the vertical direction. The P-type contact region 209 is formed in the P-type body region 206, in direct contact with and beneath the epitaxial layer surface 202a in the vertical direction, and the P-type contact region 209 is adjacent to the N-type contact region 208 in the lateral direction. The N-type drain 210 is formed in the N-type well 207, in direct contact with and beneath the epitaxial layer surface 202a, and the N-type drain 210 is located between the drift oxide region 204 and the isolation oxide region 203. The N-type contact region 208 and the N-type drain 210 can be formed by for example but not limited to a same lithography step and a same ion implantation step.

Figure 3I:
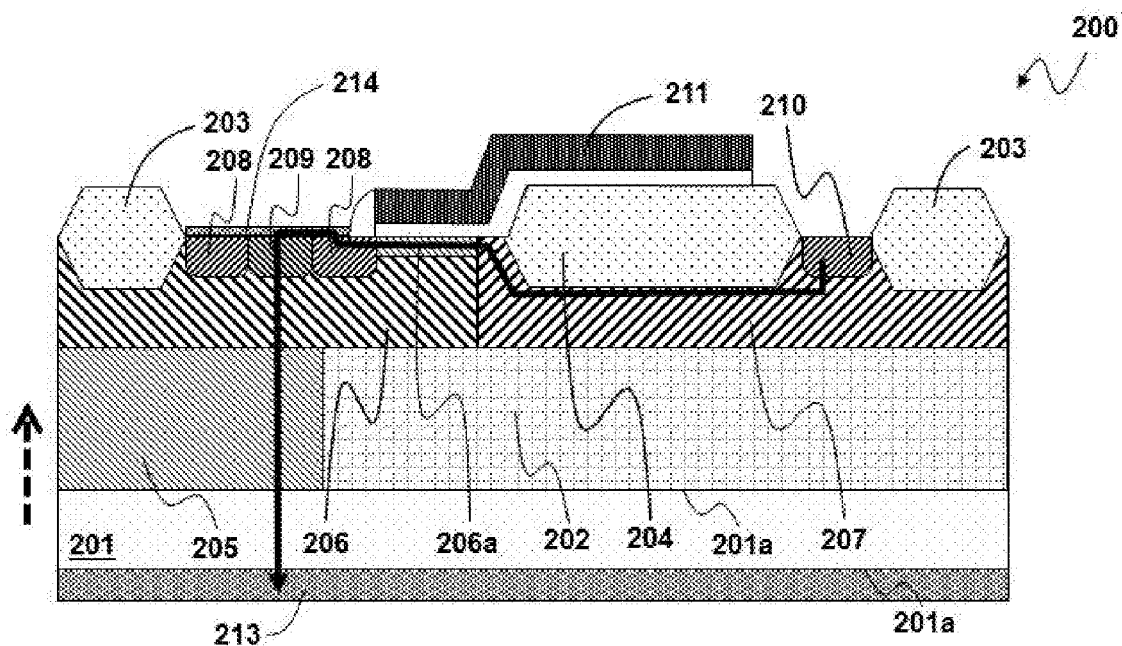

Next, as shown in FIG. 3I, the top source 214 is formed on the epitaxial layer 202, in direct contact with the N-type contact region 208 and the P-type contact region 209 in the vertical direction. The bottom source 213 is formed beneath and in direct contact with the lower surface 201a of the P-type substrate 201 in the vertical direction. In normal operation when the LDMOS device 200 is turned ON, the conductive current flows from the N-type drain 210, through the N-type well 207, the P-type body region 206, the N-type contact region 208, the top source 214, the P-type contact region 209, the P-type body region 206, the P-type high voltage well 205, and the P-type substrate 201, to the bottom source 213. The top source 214 and the bottom source 213 for example include a metal layer or a metal silicide layer. The present invention provides the conductive current with a lower resistance path which passes through the peak concentration region 206a of the body region 206, when the LDMOS device 200 is turned ON (i.e., when a voltage is applied to the gate 211 such that a channel is formed in the body region 206 beneath the gate 211 and the conductive current flows from the N-type well 207 through the P-type body region 206).

Figure 4:
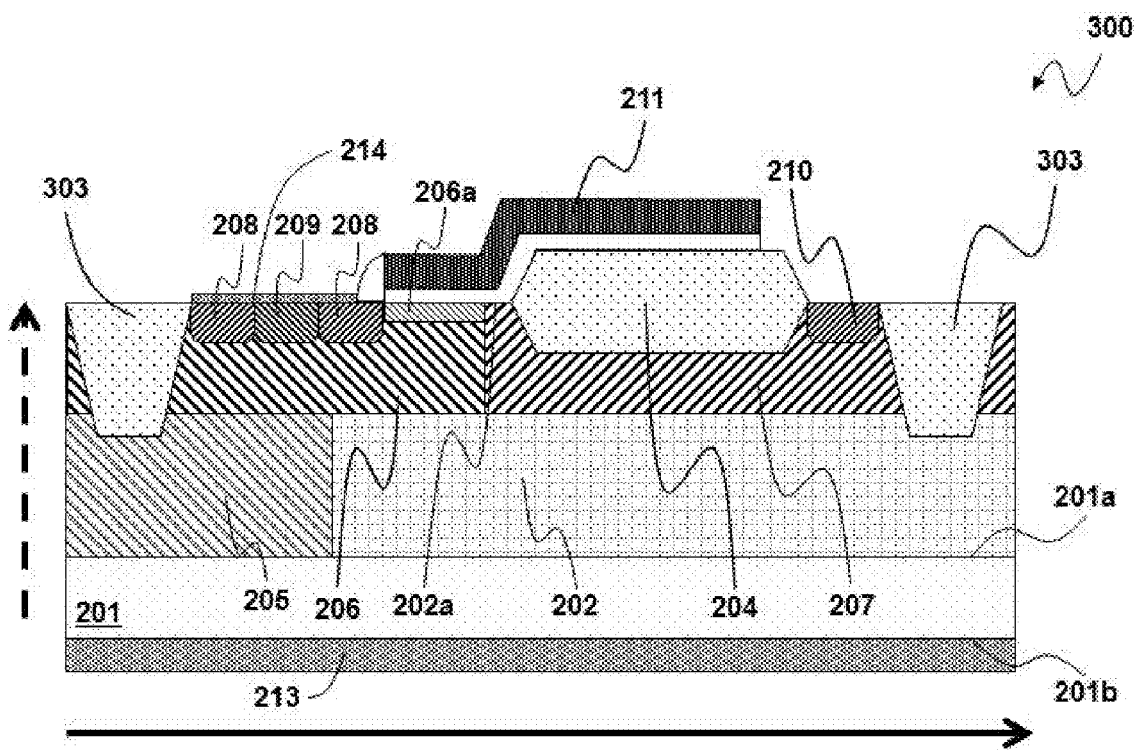
FIG. 4 shows a third embodiment of the present invention.

Please refer to FIG. 4 for a third embodiment according to the present invention, wherein FIG. 4 is a schematic diagram showing an LDMOS device 300 from a cross-section view. FIG. 4 shows that the isolation oxide region 303 can be a shallow trench isolation (STI) structure, which is different from the local oxidation of silicon (LOCOS) structure as shown in the first embodiment. The other process steps for forming the LDMOS device 300 are substantially the same as the first embodiment. Similarly, the drift oxidation region 204 can be an STI structure instead of the LOCOS structure.

Note that, the present invention is different from the prior art in many ways. For example, in the LDMOS device 200 of the present invention, a series resistance from the top source 214 to the bottom source 213 is relatively lower than the prior art. Part of the P-type body region 206 is located beneath the N-type contact region 208 and the P-type contact region 209 in the vertical direction, but the peak concentration region 206a is not located below the N-type contact region 208 and the P-type contact region 209 in the vertical direction, and the peak concentration region 206a is adjacent to the N-type contact region 208 in the lateral direction. This arrangement provides a better effect for suppressing the parasitic NPN bipolar transistor. In addition, the LDMOS device according to the present invention has the bottom source 213 beneath the lower surface 201b, so another power device can be connected (through its drain, for example) in series to the bottom source 213 beneath the lower surface 201b, and this arrangement can improve the heat dissipation efficiency.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography step described in the above can be replaced by electron beam lithography, X-ray lithography, etc.; for another example, in all the aforementioned embodiments, the conductive types (the N-type and the P-type) may be interchanged with corresponding modifications in other regions. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A lateral double diffused metal oxide semiconductor (LDMOS) device, comprising:
   a P-type substrate, which has an upper surface and a lower surface opposite to each other in a vertical direction;
   an epitaxial layer, which is formed on the P-type substrate and in direct contact with the upper surface, and has an epitaxial layer surface opposite to the upper surface in the vertical direction;
   a P-type high voltage well, which is formed in the epitaxial layer, and is in direct contact with the upper surface of the P-type substrate;
   a P-type body region, which is formed in the epitaxial layer and on the P-type high voltage well, the P-type body region being located between and connecting the P-type high voltage well and the epitaxial layer surface, wherein the P-type body region includes a peak concentration region which has a highest P-type impurity concentration in the P-type body region, the peak concentration region being in direct contact with and beneath the epitaxial layer surface;
   an N-type well, which is formed in the epitaxial layer, the N-type well being in direct contact with and beneath the epitaxial layer surface in the vertical direction, and being adjacent to the P-type body region in a lateral direction;
   an isolation oxide region, which is formed on the epitaxial layer to define an operation region;
   a drift oxide region, which is formed in the operation region and on the epitaxial layer, the drift oxide region being in direct contact with the N-type well in the vertical direction;
   a gate, which is formed in the operation region and on or above the epitaxial layer, the gate overlaying at least part of the drift oxide region, part of the N-type well and part of the P-type body region, part of the gate being in direct contact with the epitaxial layer;
   an N-type contact region, which is formed in the P-type body region, and is in direct contact with and beneath the epitaxial layer surface in the vertical direction;
   a P-type contact region, which is formed in the P-type body region, the P-type contact region being in direct contact with and beneath the epitaxial layer surface in the vertical direction, and being adjacent to the N-type contact region in the lateral direction;
   an top source, which is formed on the epitaxial layer, and is in direct contact with the N-type contact region and the P-type contact region in the vertical direction;
   a bottom source, which is formed beneath the lower surface of the P-type substrate in the vertical direction, and is in direct contact with the lower surface; and
   an N-type drain, which is formed in the N-type well, and is in direct contact with and beneath the epitaxial layer surface, wherein the N-type drain is located between the drift oxide region and the isolation oxide region;
   wherein part of the P-type body region is located beneath the N-type contact region and the P-type contact region in the vertical direction, wherein the peak concentration region is not located below the N-type contact region and the P-type contact region in the vertical direction, and the peak concentration region is adjacent to the N-type contact region in the lateral direction;
   wherein a conductive current flows from the N-type drain to the bottom source in a normal operation when the LDMOS device is turned ON.

2. The LDMOS device of claim 1, wherein the isolation oxide region is a local oxidation of silicon (LOCOS) structure or a shallow trench isolation (STI) structure, and the drift oxide region is a local oxidation of silicon (LOCOS) structure or a shallow trench isolation (STI) structure.

3. The LDMOS device of claim 1, wherein the conductive current flows from the N-type drain, through the N-type well, the P-type body region, the N-type contact region, the top source, the P-type contact region, the P-type body region, the P-type high voltage well, and the P-type substrate, to the bottom source.

4. The LDMOS device of claim 1, wherein the top source includes a metal layer or a metal silicide layer.

5. The LDMOS device of claim 1, wherein the bottom source includes a metal layer or a metal silicide layer.

\* \* \* \* \*